United States Patent
Krivokapic

(10) Patent No.: US 7,611,935 B2
(45) Date of Patent: Nov. 3, 2009

(54) GATE STRAINING IN A SEMICONDUCTOR DEVICE

(75) Inventor: Zoran Krivokapic, Santa Clara, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 204 days.

(21) Appl. No.: 11/753,438

(22) Filed: May 24, 2007

(65) Prior Publication Data

US 2008/0293195 A1 Nov. 27, 2008

(51) Int. Cl.
*H01L 21/336* (2006.01)
*H01L 21/8234* (2006.01)

(52) U.S. Cl. ............... 438/197; 438/199; 257/E21.409; 257/E21.632

(58) Field of Classification Search ........ 438/199, 438/197; 257/274, 288, E21.409, E21.632
See application file for complete search history.

(56) References Cited

U.S. PATENT DOCUMENTS

| | | | | |
|---|---|---|---|---|
| 5,895,955 | A * | 4/1999 | Gardner et al. ............. | 257/336 |
| 6,596,623 | B1 * | 7/2003 | Subramanian et al. ...... | 438/618 |
| 2003/0181005 | A1 * | 9/2003 | Hachimine et al. .......... | 438/231 |
| 2004/0058499 | A1 * | 3/2004 | Ishitsuka et al. ............ | 438/296 |
| 2005/0087870 | A1 * | 4/2005 | Adetutu et al. ............. | 257/751 |
| 2005/0156199 | A1 * | 7/2005 | Ko et al. ................... | 257/204 |
| 2005/0214998 | A1 * | 9/2005 | Chen et al. ................ | 438/199 |
| 2007/0048958 | A1 * | 3/2007 | Liao et al. ................ | 438/369 |
| 2007/0063286 | A1 * | 3/2007 | Kotani ..................... | 257/365 |
| 2008/0083955 | A1 * | 4/2008 | Kanarsky et al. ........... | 257/382 |
| 2008/0217665 | A1 * | 9/2008 | Chen et al. ................ | 257/288 |
| 2008/0258234 | A1 * | 10/2008 | Henson et al. ............. | 257/384 |

* cited by examiner

*Primary Examiner*—Thanh V Pham
*Assistant Examiner*—Duy T Nguyen
(74) *Attorney, Agent, or Firm*—Ingrassia Fisher & Lorenz, P.C.

(57) ABSTRACT

Gate straining techniques as described herein can be utilized during the fabrication of NMOS transistor devices, PMOS transistor devices, or CMOS device structures. For an NMOS device, conductive vias are formed in TEOS oxide regions surrounding the sidewall spacers of a metal gate structure, where the metal gate structure includes compressive nitride material within the gate opening. After forming the conductive vias the remaining TEOS oxide is removed and tensile nitride material is deposited between the sidewall spacers and the conductive vias. The sidewall spacers serve as retaining walls for the tensile nitride material, which preserves the tensile characteristics of the material. A similar fabrication technique is utilized to form a PMOS device. For a PMOS device, however, the metal gate structure includes tensile nitride material within the gate opening, and compressive nitride material between the sidewall spacers and the conductive vias.

18 Claims, 7 Drawing Sheets

GATE STRAINING IN A SEMICONDUCTOR DEVICE

TECHNICAL FIELD

Embodiments of the subject matter described herein relate generally to the fabrication of semiconductor devices. More particularly, embodiments of the subject matter relate to a gate straining technique for metal-oxide-semiconductor (MOS) devices.

BACKGROUND

The prior art is replete with different techniques and processes for fabricating semiconductor devices such as MOS transistors. In accordance with one known fabrication technique, a MOS transistor is formed by creating a device structure on a semiconductor substrate, where the device structure includes a metal gate between two sidewall spacers. The area between the sidewall spacers and above the metal gate represents a gate opening. Gate straining is sometimes used to enhance the performance of MOS transistors—gate straining can be achieved by depositing strain-inducing material (such as compressive or tensile nitride) within the gate opening of the transistor and around the sidewall spacers.

Conductive vias that serve as source and drain interconnects can be formed in the strain-inducing material that surrounds the sidewall spacers. Conventional fabrication processes create the via holes after the strain-inducing material has been formed around the sidewall spacers. The creation of the via holes may cause the strain-inducing material to relax because the via holes result in a "free" boundary of the strain-inducing material. Relaxation of the strain-inducing material at this junction is undesirable because the beneficial strain-inducing characteristics of the material may be reduced or eliminated.

BRIEF SUMMARY

Semiconductor fabrication techniques as described herein can be utilized to create a semiconductor device such as an NMOS transistor, a PMOS transistor, or a complementary metal-oxide-semiconductor (CMOS) transistor device. More specifically, the fabrication techniques employ gate straining in a manner that retains the strain-inducing properties of the strain-inducing materials. These fabrication techniques result in increased gate straining relative to conventional techniques that might suffer from a loss of strain caused by the formation of vias.

The above and other aspects may be carried out by an embodiment of a method for fabricating a semiconductor device. The method begins by providing a device structure on a semiconductor substrate, where the device structure includes a first spacer, a second spacer, a gate opening formed between the first spacer and the second spacer, a first oxide region adjacent to and outside the first spacer, and a second oxide region adjacent to and outside the second spacer. The method also involves: filling the gate opening with a compressive insulating material; forming a first conductive via in the first oxide region, and a second conductive via in the second oxide region; thereafter removing the first oxide region and the second oxide region; and depositing a tensile insulating material between the first conductive via and the first spacer, between the second conductive via and the second spacer, and over the compressive insulating material.

Another embodiment of a method for fabricating a semiconductor device involves: filling the gate opening with a tensile insulating material; forming a first conductive via in the first oxide region, and a second conductive via in the second oxide region; thereafter removing the first oxide region and the second oxide region; and depositing a compressive insulating material between the first conductive via and the first spacer, between the second conductive via and the second spacer, and over the tensile insulating material.

The above and other aspects may be carried out by an embodiment of a method for fabricating a semiconductor device, such as a CMOS device. The method involves: forming an NMOS device structure on a semiconductor substrate, the NMOS device structure including a first pair of spacers, compressive insulating material between the first pair of spacers, and oxide material adjacent to and outside the first pair of spacers; and forming a PMOS device structure on the semiconductor substrate, the PMOS device structure including a second pair of spacers, tensile insulating material between the second pair of spacers, and oxide material adjacent to and outside the second pair of spacers. For the NMOS device structure, the method involves: forming first conductive vias in the oxide material of the NMOS device structure; thereafter removing the oxide material of the NMOS device structure, resulting in first openings between the first pair of spacers and the first conductive vias; and depositing tensile insulating material in the first openings. For the PMOS device structure, the method involves: forming second conductive vias in the oxide material of the PMOS device structure; thereafter removing the oxide material of the PMOS device structure, resulting in second openings between the second pair of spacers and the second conductive vias; and depositing compressive insulating material in the second openings.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the invention or the application and uses of such embodiments. For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of MOS transistors are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
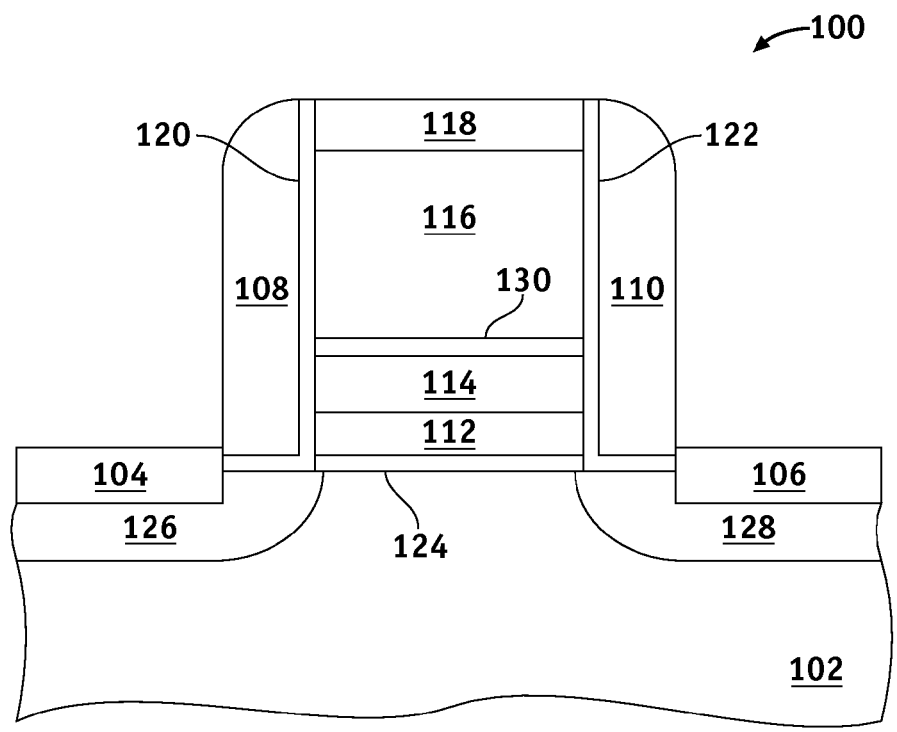
FIGS. 1-7 are cross sectional views that illustrate an exemplary NMOS device and a method of fabricating the NMOS device.

FIGS. 1-7 are cross sectional views that illustrate an NMOS device and a method of fabricating the NMOS device. The fabrication method utilizes gate straining techniques as described herein. FIG. 1 depicts an intermediate state in the fabrication process after formation of a suitably configured NMOS device structure 100. NMOS device structure 100 is formed using well known techniques and process steps (e.g., techniques and steps related to doping, photolithography and patterning, etching, material growth, material deposition, surface planarization, and the like). For this embodiment, NMOS device structure 100 includes, without limitation: a semiconductor substrate 102; a source region 126; a drain region 128; a source silicide contact 104; a drain silicide contact 106; a sidewall spacer 108; a sidewall spacer 110; a gate insulator 112; a gate metal layer 114; polycrystalline silicon (also referred to herein as "poly" or "polysilicon") 116; an anti-reflective layer 118; an oxide liner 120; an oxide liner 122; and pad oxide 124. NMOS device structure 100 may also include an optional diffusion barrier layer 130, which can be, for example, a silicon nitride (also referred to herein as simply "nitride") layer.

Semiconductor substrate 102 is preferably a monocrystalline silicon substrate, where the term "silicon substrate" is used herein to encompass the generally monocrystalline and relatively pure silicon materials typically used in the semiconductor industry. Semiconductor substrate 102 can be either N-type or P-type, but is typically P-type. Semiconductor substrate 102 may be a bulk silicon wafer or a thin layer of silicon on an insulating layer (commonly known as silicon-on-insulator or SOI) that, in turn, is supported by a silicon carrier wafer, but is here illustrated, without limitation, as a bulk silicon wafer. Source region 126 and drain region 128 are doped with N-type impurity dopants. These regions can be doped to the appropriate conductivity, for example, by ion implantation. Shallow trench isolation (STI) may be employed for electrical isolation between the wells, and to isolate around individual devices that must be electrically isolated. As is well known, there are many processes that can be used to form the STI, and such processes need not be described here in detail. It should be noted that SOI films are usually undoped. The film is thin enough so that the gate fully depletes the channel and thus electrically insulates the source and drain. For SOI applications, STI may be used, but the preferred embodiment uses mesa isolation, where a thin silicon layer is etched away in the field and very shallow trenches are not filled with any special dielectric (like STI fill).

Source silicide contact 104 forms a conductive contact to source region 126, and drain silicide contact 106 forms a conductive contact to drain region 128. Silicide contacts 104/106 are formed from a metal silicide, and they eventually function as conductive elements for subsequently formed electrical interconnects. In this embodiment, source silicide contact 104 and drain silicide contact 106 are produced by depositing a silicide-forming metal (such as nickel) onto the wafer surface by, for example, a sputtering process. Upon heating, the silicide-forming metal reacts with semiconductor substrate 102 to produce source silicide contact 104 and drain silicide contact 106. In practice, source silicide contact 104 and drain silicide contact 106 are approximately 5-20 nm thick.

Gate insulator 112 may be realized as a thermally grown layer or as a deposited material. Gate insulator 112 is located between spacer 108 and spacer 110, and gate insulator 112 is located on pad oxide 124. More specifically, gate insulator 112 is located between oxide liner 120 and oxide liner 122. Gate insulator 112 is preferably an oxide material having a high dielectric constant (such as $HfO_2$, HfSiON, $LaAlO_3$, or $Al_2O_3$), which is formed by atomic layer deposition (ALD) or chemical vapor deposition (CVD). In practice, gate insulator 112 is about 1.5-3.0 nm thick.

Oxide 124 can be a silicon oxide interface layer that is formed by exposing the silicon surface to an oxygen environment. Oxide 124 protects the silicon surface from reacting with metal from the high dielectric constant gate insulator 112.

Gate metal layer 114 is located between spacer 108 and spacer 110, and gate metal layer 114 is located on gate insulator 112. More specifically, gate metal layer 114 is located between oxide liner 120 and oxide liner 122. In accordance with known techniques, gate metal layer 114 may extend beyond the NMOS device (i.e., into or out of the page relative to orientation depicted in FIG. 1) to accommodate the formation of conductive interconnects for gate metal layer 114. Gate metal layer 114 may be formed from a metal such as TiN, La, Er, Tb, Pt, Ni, Ir, Ru, $RuO_2$, $IrO_2$, TaCN, TaN, W, or WN. In preferred embodiments, gate metal layer 114 is formed from TiN having a thickness within the range of about 10-20 nm. Use of a relatively thin gate metal layer 114 is desirable to reduce parasitic capacitance (both fringe and gate-to-via) in the device.

The optional diffusion barrier layer 130 may be utilized in some embodiments as a diffusion barrier for gate metal layer 114. Although diffusion barrier layer 130 is optional, the figures include it for the sake of completeness. Those skilled in the art should be able to easily envision equivalent embodiments that lack diffusion barrier layer 130. As depicted in FIG. 1, diffusion barrier layer 130 is located between spacer 108 and spacer 110, and diffusion barrier layer 130 is located above gate metal layer 114. More specifically, diffusion barrier layer 130 is located between oxide liner 120 and oxide liner 122, and diffusion barrier layer 130 is located on gate metal layer 114. In contrast to the compressive nitride materials and the tensile nitride materials described below, diffusion barrier layer 130 is realized using "normal" nitride material that has little or no strain-inducing properties. Diffusion barrier layer 130 can be deposited using, for example, low pressure chemical vapor deposition (LPCVD). Diffusion barrier layer 130 is realized as a relatively thin layer having a thickness in the range of a 20-40 Angstroms. Diffusion barrier layer 130 prevents oxygen from diffusing through gate metal layer 114 and the high-K dielectric material used for gate insulator 112 and forms silicon dioxide at the silicon-dielectric interface, thus increasing the effective dielectric thickness.

Polysilicon 116 is located between spacer 108 and spacer 110. More specifically, polysilicon 116 is located between oxide liner 120 and oxide liner 122. In the illustrated embodiment, polysilicon 116 is located on diffusion barrier layer 130. In an embodiment that lacks diffusion barrier layer 130, polysilicon 116 is located on gate metal layer 114. Typically, polysilicon 116 will have a thickness within the range of about 50-100 nm. Polysilicon 116 is utilized here to provide the minimum height required to create spacers 108/110. This additional height is needed due to the relatively short profile of gate metal layer 114. Of course, the actual height of polysilicon 116 will depend upon the desired height of spacers 108/110. Polysilicon 116 is capped with anti-reflective layer 118. Anti-reflective layer 118 may be formed from a dielectric material, such as SiON that is deposited using plasma enhanced chemical vapor deposition (PECVD). For a typical embodiment, anti-reflective layer 118 will have a thickness within the range of about 30-50 nm, depending upon the wavelength of the lithographic tool. As shown in FIG. 1, the upper surface of anti-reflective layer 118 roughly corresponds to the heights of spacer 108, spacer 110, oxide liner 120, and oxide liner 122.

In preferred embodiments, spacers 108/110 are formed from "normal" nitride material that has little or no strain-inducing properties. Here, spacer 108 is adjacent to source silicide contact 104, and spacer 110 is adjacent to drain silicide contact 106. As described in more detail below, spacers 108/110 generally define a gate opening 152 for the NMOS device (see FIG. 2). This gate opening 152 is eventually filled during subsequent process steps.

Figure 2:
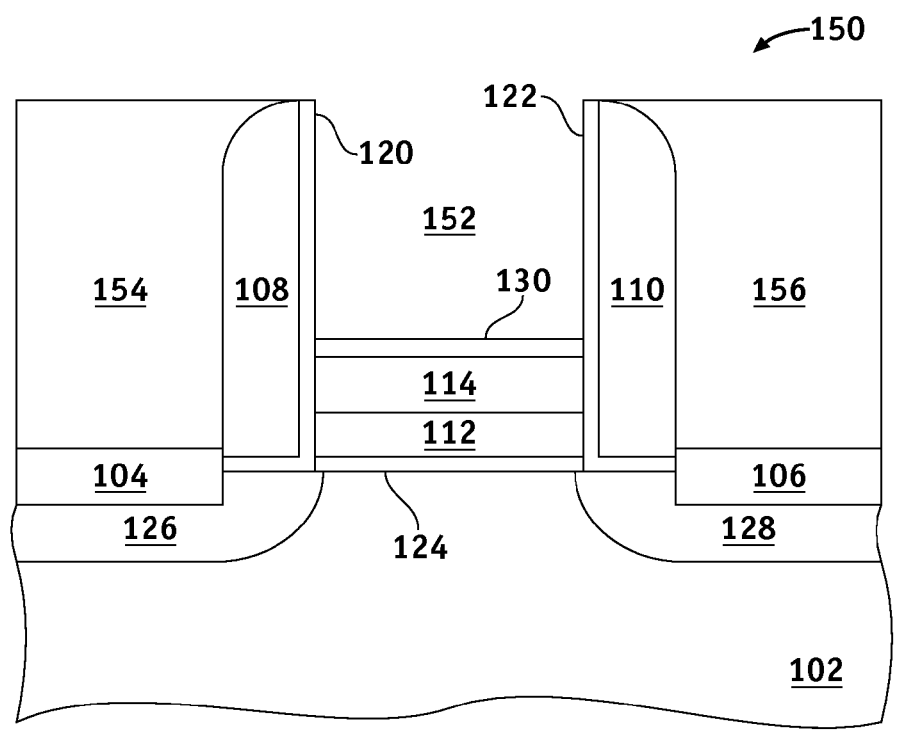

As mentioned above, NMOS device structure 100 can be provided by performing various fabrication steps that result in that depicted in FIG. 1. Thereafter, NMOS device structure 100 can be further processed in the manner described herein. For example, FIG. 2 depicts an NMOS device structure 150 that represents NMOS device structure 100 after it has been subjected to additional fabrication steps. More specifically, NMOS device structure 150 is created by forming a layer of oxide, such as tetraethyl orthosilicate (TEOS) oxide over NMOS device structure 100, planarizing the TEOS oxide (stopping on anti-reflective layer 118), and thereafter removing anti-reflective layer 118 using, for example, a wet process. Although TEOS is utilized in this embodiment, source materials other than TEOS can be used to deposit oxide for this layer, as long as the materials have etch selectivity relative to the SiON anti-reflective layer. Thereafter, polysilicon 116 is etched away, stopping at diffusion barrier layer 130 or, in embodiments that lack diffusion barrier layer 130, stopping at gate metal layer 114. These process steps result in NMOS device structure 150. If the NMOS device is embodied in a CMOS device, then the PMOS devices are protected during these process steps using, for example, a photoresist coating.

Notably, NMOS device structure 150 includes a gate opening 152 formed between spacer 108 and spacer 110. More particularly, gate opening 152 is formed between, and is defined by, oxide liner 120 and oxide liner 122. In the illustrated embodiment, gate opening 152 terminates at diffusion barrier layer 130. In alternate embodiments that lack diffusion barrier layer 130, gate opening 152 terminates at gate metal layer 114. As depicted in FIG. 2, NMOS device structure 150 includes a first TEOS oxide region 154 and a second TEOS oxide region 156, both of which remain from the layer of TEOS oxide. It should be appreciated that these TEOS oxide regions may represent different sections of one TEOS oxide area. In other words, TEOS oxide regions 154/156 need not be physically separated and physically distinct regions. TEOS oxide region 154 is adjacent to and outside spacer 108, while TEOS oxide region 156 is adjacent to and outside spacer 110. Moreover, at least a portion of TEOS oxide region 154 resides on source silicide contact 104, and at least a portion of TEOS oxide region 156 resides on drain silicide contact 106. As described in more detail below, TEOS oxide regions 154/156 provide support to spacers 108/110 during subsequent fabrication steps.

Figure 3:
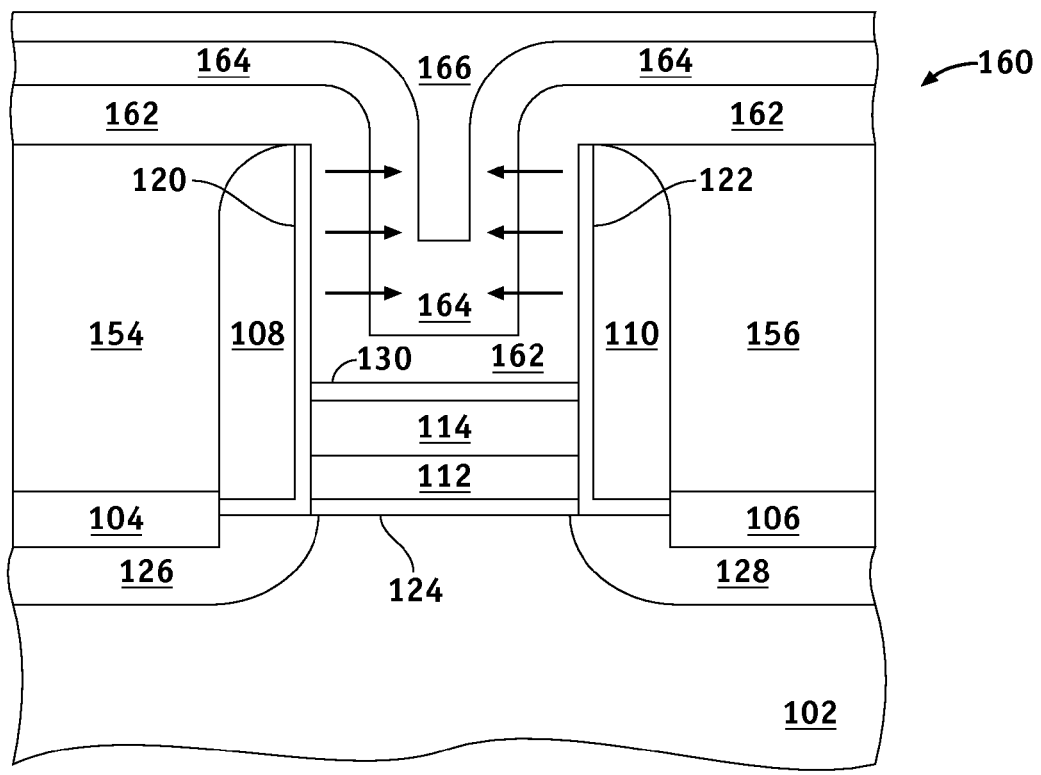

Accordingly, NMOS device structure 150 can be provided by performing various fabrication steps that result in that depicted in FIG. 2. Thereafter, NMOS device structure 150 can be further processed in the manner described herein. For example, FIG. 3 depicts an NMOS device structure 160 that represents NMOS device structure 150 after it has been subjected to additional fabrication steps. Generally, at least one layer of compressive insulating material is formed in gate opening 152, thus filling gate opening 152 with compressive insulating material.

As used herein, a "compressive insulating material" is an insulating material, such as silicon nitride, that has strain-inducing characteristics that result in stress directed in an inward direction; the material tends to shrink. The inward facing arrows within the gate opening in FIG. 3 represent this compressive stress. The compressive insulating material tends to shrink after it is deposited within the gate opening. This tendency towards shrinkage causes compressive stress within the gate opening, which imparts inward forces on spacers 108/110.

FIG. 3 depicts an embodiment where a first layer of compressive insulating material 162 is deposited in gate opening 152, followed by a second layer of compressive insulating material 164, and followed by a third layer of compressive insulating material 166. In practice, first layer of compressive insulating material 162 is formed on diffusion barrier layer 130 (or on gate metal layer 114 if the NMOS device lacks diffusion barrier layer 130), over oxide liners 120/122, over spacers 108/110, and over TEOS oxide regions 154/156. First layer of compressive insulating material 162 generally follows the contour of gate opening 152, and it covers the interior surfaces of oxide liners 120/122. After first layer of compressive insulating material 162 has been deposited, its surface is allowed to relax (set up). This results in the retention of more compressive stress in first layer of compressive insulating material 162. Thereafter, second layer of compressive insulating material 164 is deposited in gate opening 152, and over first layer of compressive insulating material 162, then allowed to relax. Thereafter, third layer of compressive insulating material 166 is deposited in gate opening 152, and over second layer of compressive insulating material 164, then allowed to relax. Although not a requirement, each layer of compressive insulating material is formed from the same material in this embodiment.

The number of compressive insulating layers and the thickness of each compressive insulating layer can vary from one embodiment to another. In particular, the number of compressive insulating layers and the thickness of the layers will depend upon the dimensions of the gate opening. For example, it may be possible to use only one compressive insulating layer if the gate opening is relatively shallow and/or relatively narrow. On the other hand, at least one additional layer can be deposited on the first compressive insulating layer if the gate opening is relatively deep and/or relatively wide. In practical embodiments, the gate length is typically around 30-40 nm, and the thickness of each layer of compressive insulating material is typically around 5-10 nm.

Figure 4:
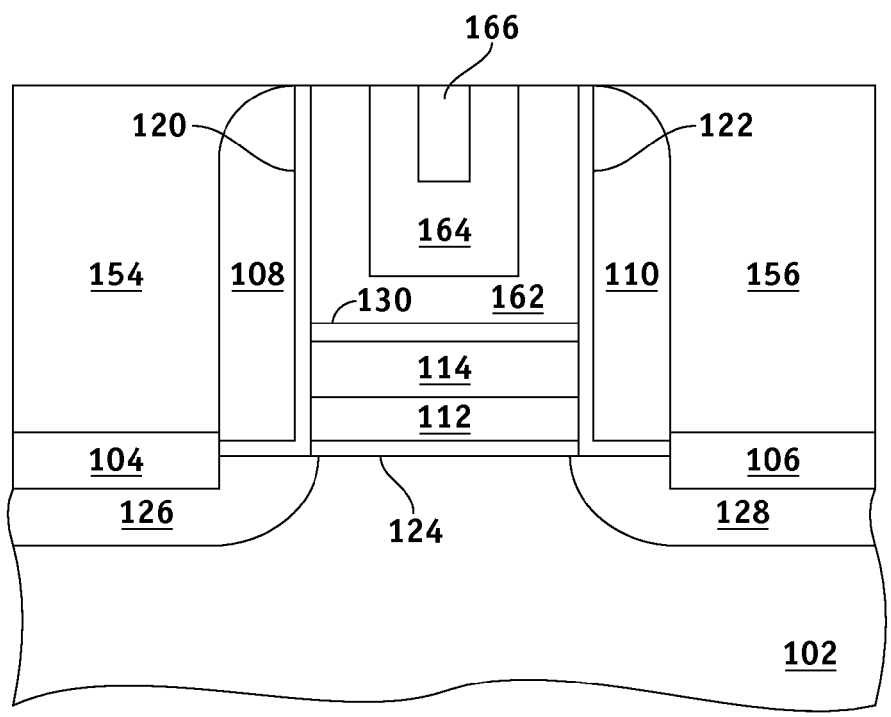

After the formation of one of more layers of compressive insulating material as described above, the process continues by removing excess compressive insulating material from the wafer. FIG. 4 depicts the NMOS device after removal of the excess compressive insulating material located over TEOS oxide regions 154/156 and located over gate opening 152. In practice, this excess compressive insulating material is removed by etching, e.g., using a blanket etch-back technique. As shown in FIG. 4, the remaining compressive insulating material fills gate opening 152, between the pair of spacers 108/110. In preferred embodiments, the upper surface of the remaining compressive insulating material approximately corresponds to the upper surface of TEOS oxide regions 154/156.

Figure 5:
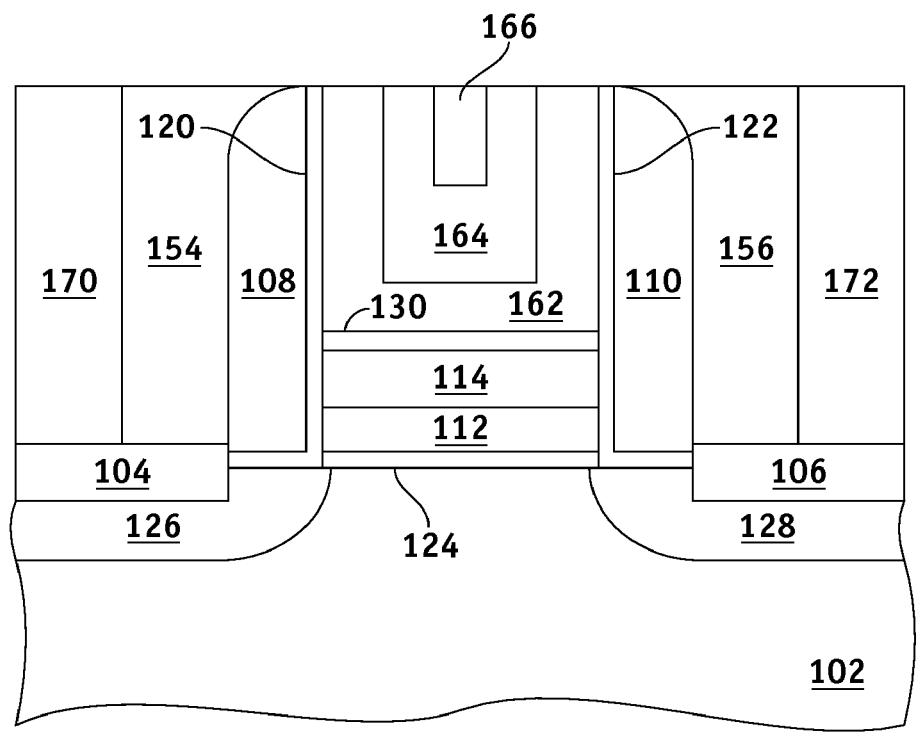

After forming the NMOS device structure depicted in FIG. 4, the fabrication process continues by forming conductive vias in TEOS oxide regions 154/156. In this regard, FIG. 5 depicts a first conductive via 170 formed in TEOS oxide region 154, and a second conductive via 172 formed in TEOS oxide region 156. Conductive via 170 is formed such that it reaches source silicide contact 104, and conductive via 172 is formed such that it reaches drain silicide contact 106. Thus, conductive via 170 represents a source interconnect for the NMOS device, and conductive via 172 represents a drain interconnect for the NMOS device. Conductive vias 170/172 are created using known techniques and fabrication process steps. Briefly, conductive vias 170/172 are formed by patterning the wafer, etching via holes in the TEOS oxide regions 154/156, and filling the via holes with a conductive material such as tungsten or copper (a number of preparatory and intermediate steps are also performed during the formation of conductive vias 170/172, however, these steps will not be described here).

Figure 6:
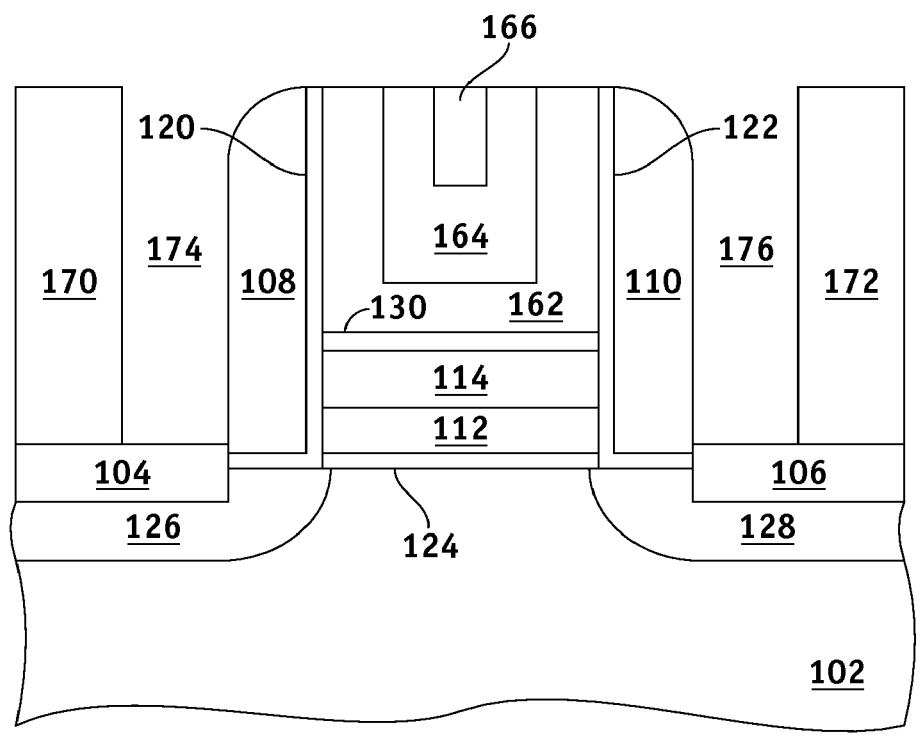

After fabrication of conductive vias 170/172, the remaining TEOS oxide regions 154/156 are removed, resulting in the NMOS device structure depicted in FIG. 6. For this embodiment, TEOS oxide regions 154/156 are removed with diluted HF (the PMOS device areas are masked with photoresist), stopping at silicide contacts 104/106. The removal of TEOS oxide regions 154/156 results in the formation of an opening 174 between conductive via 170 and spacer 108, and the formation of an opening 176 between conductive via 172 and spacer 110.

Figure 7:
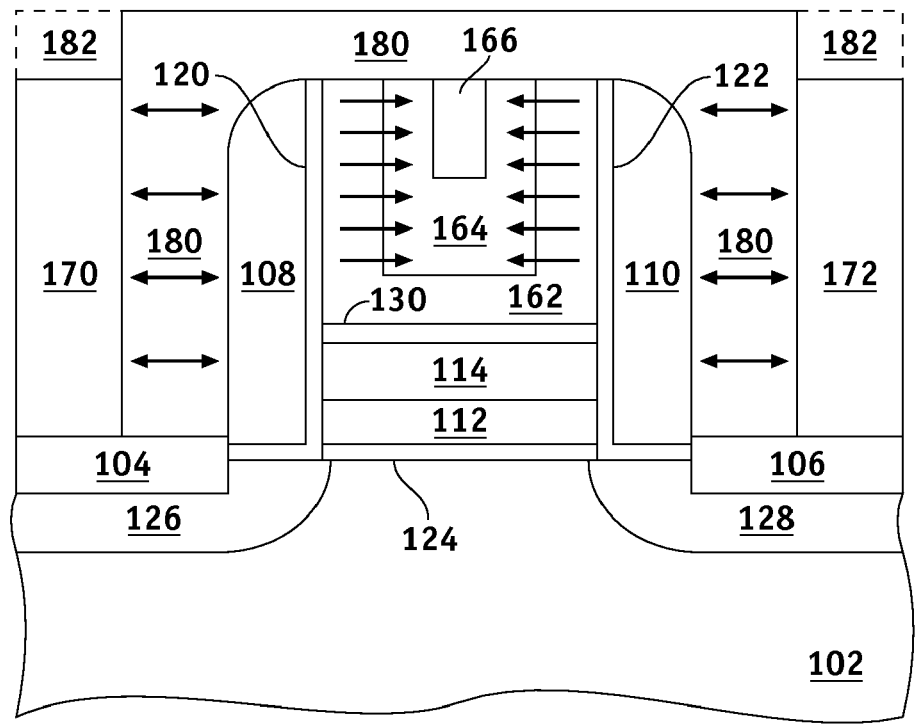

Thereafter, a tensile insulating material 180 is deposited in opening 174 and opening 176 (FIG. 7). As a result, tensile insulating material 180 fills the space between conductive via 170 and spacer 108, and the space between conductive via 172 and spacer 110. As used herein, a "tensile insulating material" is an insulating material, such as silicon nitride, that has strain-inducing characteristics that result in stress directed in an outward direction; the material tends to expand. The outward facing arrows within openings 174/176 causes represent this tensile stress. The tensile insulating material tends to expand after it is deposited within openings 174/176. This tendency towards expansion causes tensile stress within openings 174/176, which imparts outward forces on spacers 108/110 and conductive vias 170/172.

In addition, tensile insulating material 180 will be deposited over the compressive insulating material that resides in gate opening 152. This may occur concurrently with the deposition of tensile insulating material 180 in openings 174/176. Although FIG. 7 depicts an embodiment having a single layer of tensile insulating material, multiple layers of tensile insulating material may be deposited to fill openings 174/176 (in a manner similar to that described above for the multiple layers of compressive insulating material).

In practice, the deposition of tensile insulating material on the wafer may result in the deposition of excess tensile insulating material 182 over conductive vias 170/172. The excess tensile insulating material 182 located over conductive vias 170/172 can be removed to expose the upper surfaces of conductive vias 170/172. To remove the tensile layer a contact mask is used. During the lithographic step, overexposure is used to make the opening wide enough to account for any possible misalignment with the first exposure of the contact (related to the formation of the via openings). This enables subsequent formation of conductive interconnects for conductive vias 170/172. FIG. 7 depicts excess tensile insulating material 182 in dashed lines to indicate that these areas will not appear in the resulting NMOS device. Notably, the section of tensile insulating material 180 over the gate structure remains intact.

Notably, spacer 108 serves as a retaining wall for the tensile insulating material 180 that fills opening 174. Likewise, spacer 110 serves as retaining wall for the tensile insulating material that fills opening 176. These retaining walls prevent relaxation of the tensile insulating material, which is desirable to retain the tensile characteristics. This results in enhanced gate straining relative to conventional techniques that do not provide such retaining walls for the strain-inducing insulating material.

As depicted by the arrows in FIG. 7, the gate opening experiences compressive stress while spacers 108/110 are "squeezed" by the tensile forces applied by tensile insulating material 180. In practice, this form of gate straining results in a significant mobility boost in the gate channel, while lowering the conduction band for the NMOS device. This effectively reduces the back scattering of carriers back into the source, which in turn increases drive current.

Thereafter, any number of known process steps can be performed to complete the fabrication of the NMOS device. It should be appreciated that a plurality of NMOS devices on a single wafer can be concurrently fabricated using the techniques and technologies described above.

As mentioned above, the techniques and technologies described herein may also be utilized to fabricate PMOS transistor devices. In this regard, FIGS. 8-13 are cross sectional views that illustrate a PMOS device and a method of fabricating the PMOS device. The fabrication method utilizes gate straining techniques as described herein. An exemplary PMOS device may be fabricated on a wafer that only includes PMOS devices, or on a wafer for a CMOS implementation. The following relates to a CMOS implementation where the PMOS device is fabricated on the same wafer as the NMOS device described above. In this regard, the general structure depicted in FIG. 1 and FIG. 2 also applies to the fabrication of the PMOS device.

Figure 8:
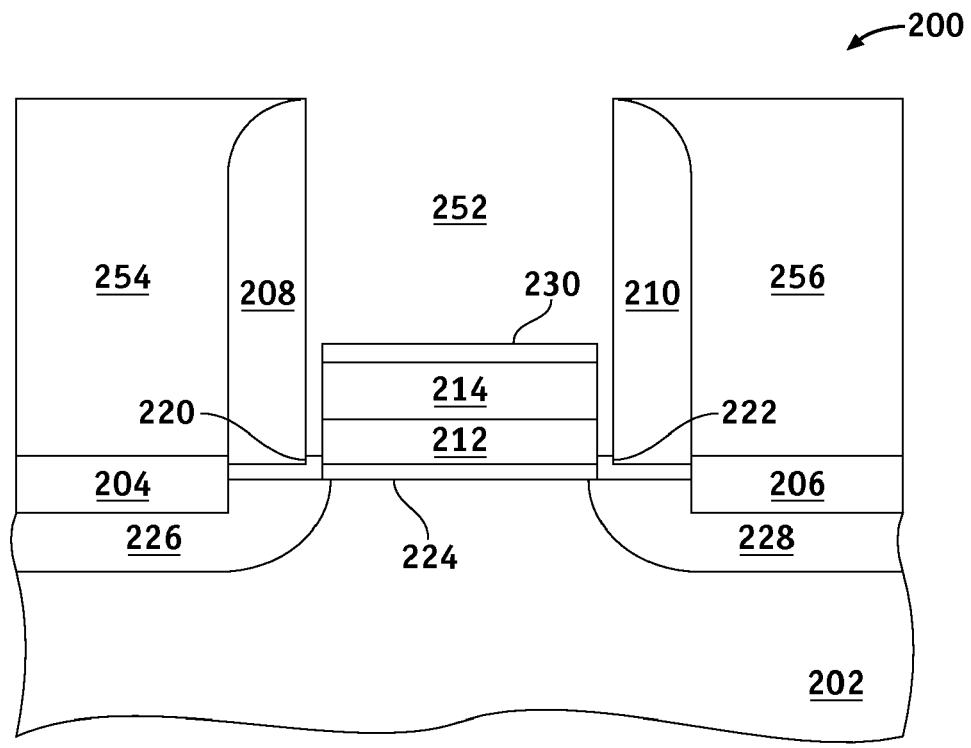
FIGS. 8-13 are cross sectional views that illustrate an exemplary PMOS device and a method of fabricating the PMOS device.

The fabrication steps described above with reference to FIG. 1 and FIG. 2 also apply in equivalent form to the PMOS device and, therefore, these steps will not be redundantly described here. FIG. 8 depicts an intermediate state in the fabrication process after formation of a suitably configured PMOS device structure 200. PMOS device structure 200 is formed using well known techniques and process steps (e.g., techniques and steps related to doping, photolithography and patterning, etching, material growth, material deposition, surface planarization, and the like). For this embodiment, PMOS device structure 200 includes, without limitation: a semiconductor substrate 202; a source region 226; a drain region 228; a source silicide contact 204; a drain silicide contact 206; a sidewall spacer 208; a sidewall spacer 210; a gate insulator 212; a gate metal layer 214; an oxide liner 220; an oxide liner 222; pad oxide 224; a gate opening 252; an oxide region 254; an oxide region 256; and an optional diffusion barrier layer 230. These features were described in detail above in the context of the NMOS device, and shared aspects, properties, functions, and characteristics will not be redundantly described here in the context of the PMOS device. In contrast to the NMOS device, the area of semiconductor substrate 202 (FIG. 8) represents an N-well formed in the P-type substrate, source region 226 is doped with P-type impurity dopants, and drain region 228 is doped with P-type impurity dopants. The source and drains regions 226/228 can be doped to the appropriate conductivity, for example, by ion implantation. In a CMOS device implementation, STI may be employed to electrically isolate between the N-wells and the P-wells. As mentioned above, SOI films are usually undoped and, for SOI applications, STI may be used, but the preferred embodiment uses mesa isolation, where a thin silicon layer is etched away in the field and very shallow trenches are not filled with any special dielectric (like STI fill).

Referring briefly to FIG. 2, oxide liners 120/122 extend along the entire sidewall of spacers 108/110. In contrast, FIG. 8 depicts the state of PMOS device structure 200 after removal of most of oxide liners 220/222 using, for example, a dilute hydrofluoric acid dip. Oxide liners 220/222 are removed such that the sidewalls of gate metal layer 214 are exposed. Removal of oxide liners 220/222 is not a necessary step, but a possible step in some embodiments. The purpose is to fill oxygen vacancies in the gate dielectric, where oxygen vacancies can pin the Fermi level close to the mid band gap, resulting in high threshold voltages for PMOS devices. Not all high-K/metal gate stacks result in the creation of oxygen vacancies. If so, then removal of oxide liners 220/222 can alleviate this problem. Oxide liners 220/222 may be removed such that the sidewalls of gate insulator 212 are also exposed. FIG. 8 illustrates completion of this optional step; oxide liners 220/222 have been partially removed to fully expose the sidewalls of gate metal layer 214 and to expose almost all of the sidewalls of gate insulator 212.

Figure 9:
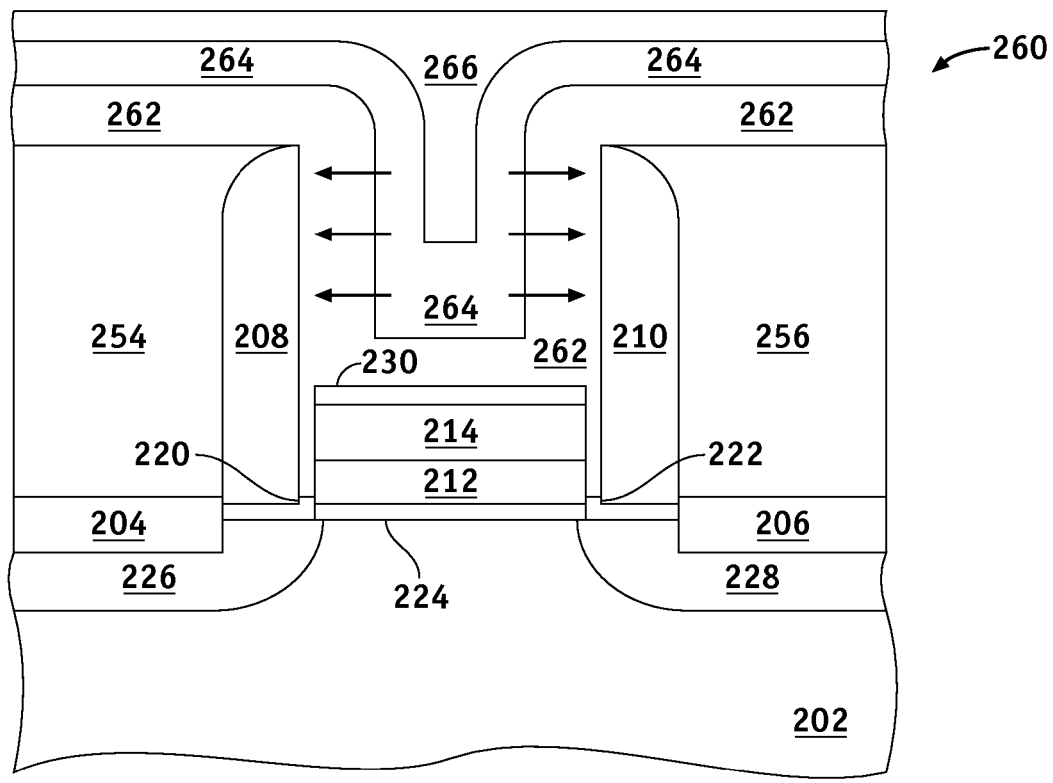

Accordingly, PMOS device structure 200 can be provided by performing various fabrication steps that result in that depicted in FIG. 8. Thereafter, PMOS device structure 200 can be further processed in the manner described herein. For example, FIG. 9 depicts a PMOS device structure 260 that represents PMOS device structure 200 after it has been subjected to additional fabrication steps. Generally, at least one layer of tensile insulating material is formed in gate opening 252, thus filling gate opening 252 with tensile insulating material. The outward facing arrows within the gate opening in FIG. 9 represent the tensile stress associated with the tensile insulating material. The tensile insulating material tends to expand after it is deposited within the gate opening. This tendency towards expansion creates tensile stress within the gate opening, which imparts outward forces on spacers 208/210.

FIG. 9 depicts an embodiment where a first layer of tensile insulating material 262 is deposited in gate opening 252, followed by a second layer of tensile insulating material 264, and followed by a third layer of tensile insulating material 266. In practice, first layer of tensile insulating material 262 is formed on diffusion barrier layer 230 (or on gate metal layer 214 if the PMOS device lacks diffusion barrier layer 230), over oxide liners 220/222, over spacers 208/210, and over TEOS oxide regions 254/256. Notably, first layer of tensile insulating material 262 fills the gap between spacer 208 and the gate structure, and the gap between spacer 210 and the gate structure. In other words, first layer of tensile insulating material 262 fills in the gaps formerly occupied by oxide liners 220/222.

First layer of tensile insulating material 262 generally follows the contour of gate opening 252, and it covers the interior surfaces of spacers 208/210. After first layer of tensile insulating material 262 has been deposited, its surface is allowed to relax (set up). This results in the retention of more tensile stress in first layer of tensile insulating material 262. Thereafter, second layer of tensile insulating material 264 is deposited in gate opening 252, and over first layer of tensile insulating material 262, then allowed to relax. Thereafter, third layer of tensile insulating material 266 is deposited in gate opening 252, and over second layer of tensile insulating material 264, then allowed to relax. Although not a requirement, each layer of tensile insulating material is formed from the same tensile nitride material in this embodiment.

The number of tensile insulating layers and the thickness of each tensile insulating layer can vary from one embodiment to another. In particular, the number of tensile insulating layers and the thickness of the layers will depend upon the dimensions of the gate opening. For example, it may be possible to use only one tensile insulating layer if the gate opening is relatively shallow and/or relatively narrow. On the other hand, at least one additional layer can be deposited on the first tensile insulating layer if the gate opening is relatively deep and/or relatively wide. In practical embodiments, the gate length is typically around 30-40 nm, and the thickness of each layer of tensile insulating material is typically around 5-10 nm.

Figure 10:
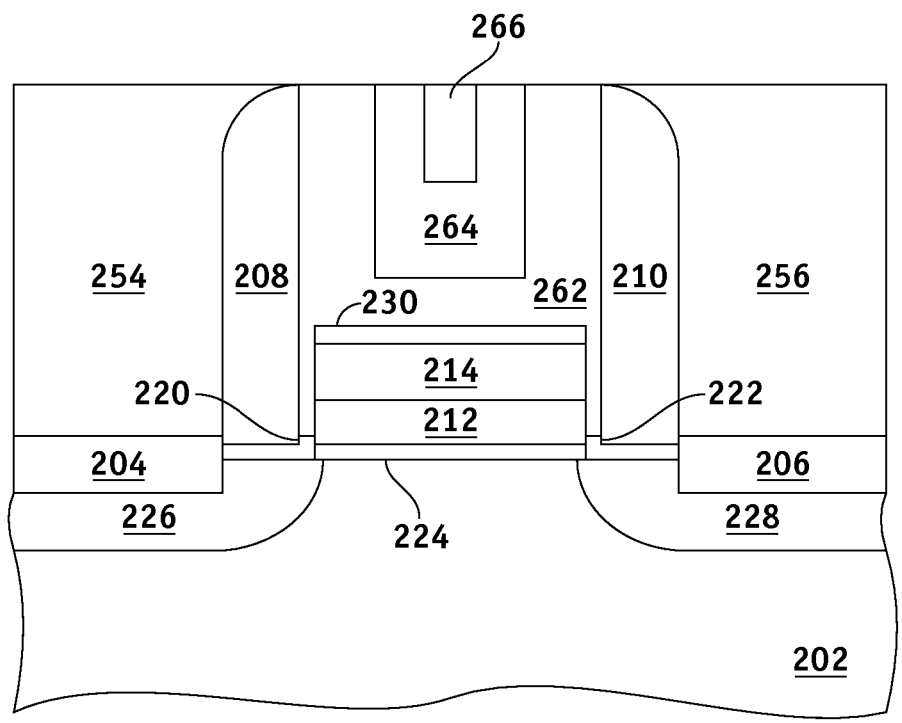

After the formation of one of more layers of tensile insulating material as described above, the process continues by removing excess tensile insulating material from the wafer. FIG. 10 depicts the PMOS device after removal of the excess tensile insulating material located over TEOS oxide regions 254/256 and located over gate opening 252. In practice, this excess tensile insulating material is removed by etching. As shown in FIG. 10, the remaining tensile insulating material fills gate opening 252, between the pair of spacers 208/210. In preferred embodiments, the upper surface of the remaining tensile insulating material approximately corresponds to the upper surface of TEOS oxide regions 254/256.

Figure 11:
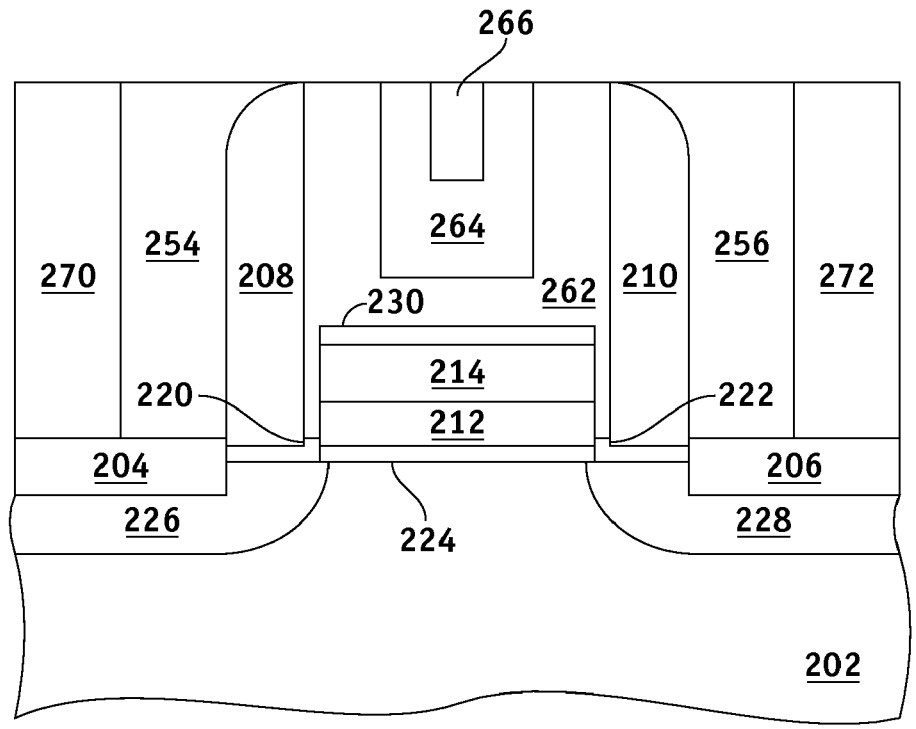

After forming the PMOS device structure depicted in FIG. 10, the fabrication process continues by forming conductive vias in TEOS oxide regions 254/256 in the manner described above with reference to FIG. 5. In this regard, FIG. 11 depicts a first conductive via 270 formed in TEOS oxide region 254, and a second conductive via 272 formed in TEOS oxide region 256. Conductive via 270 is formed such that it reaches source silicide contact 204, and conductive via 272 is formed such that it reaches drain silicide contact 206. Thus, conductive via 270 represents a source interconnect for the PMOS device, and conductive via 272 represents a drain interconnect for the PMOS device.

Figure 12:
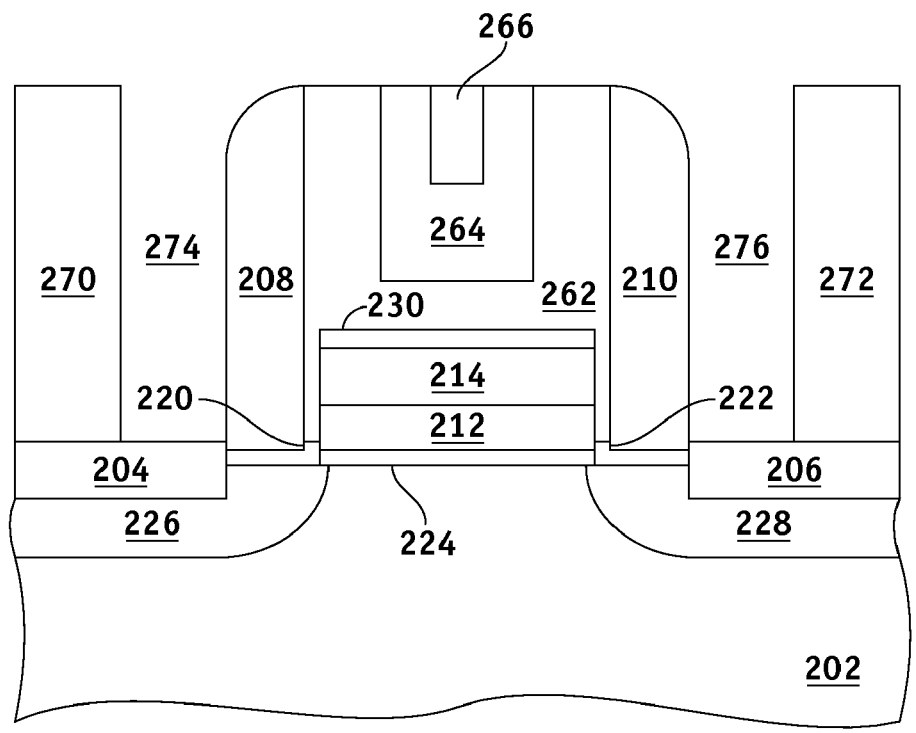

After fabrication of conductive vias 270/272, the remaining TEOS oxide regions 254/256 are removed, resulting in the PMOS device structure depicted in FIG. 12. For this embodiment, TEOS oxide regions 254/256 are removed using, for example, diluted HF (the NMOS device areas are protected by photoresist), stopping at silicide contacts 204/206. The removal of TEOS oxide regions 254/256 results in the formation of an opening 274 between conductive via 270 and spacer 208, and the formation of an opening 276 between conductive via 272 and spacer 210.

Figure 13:
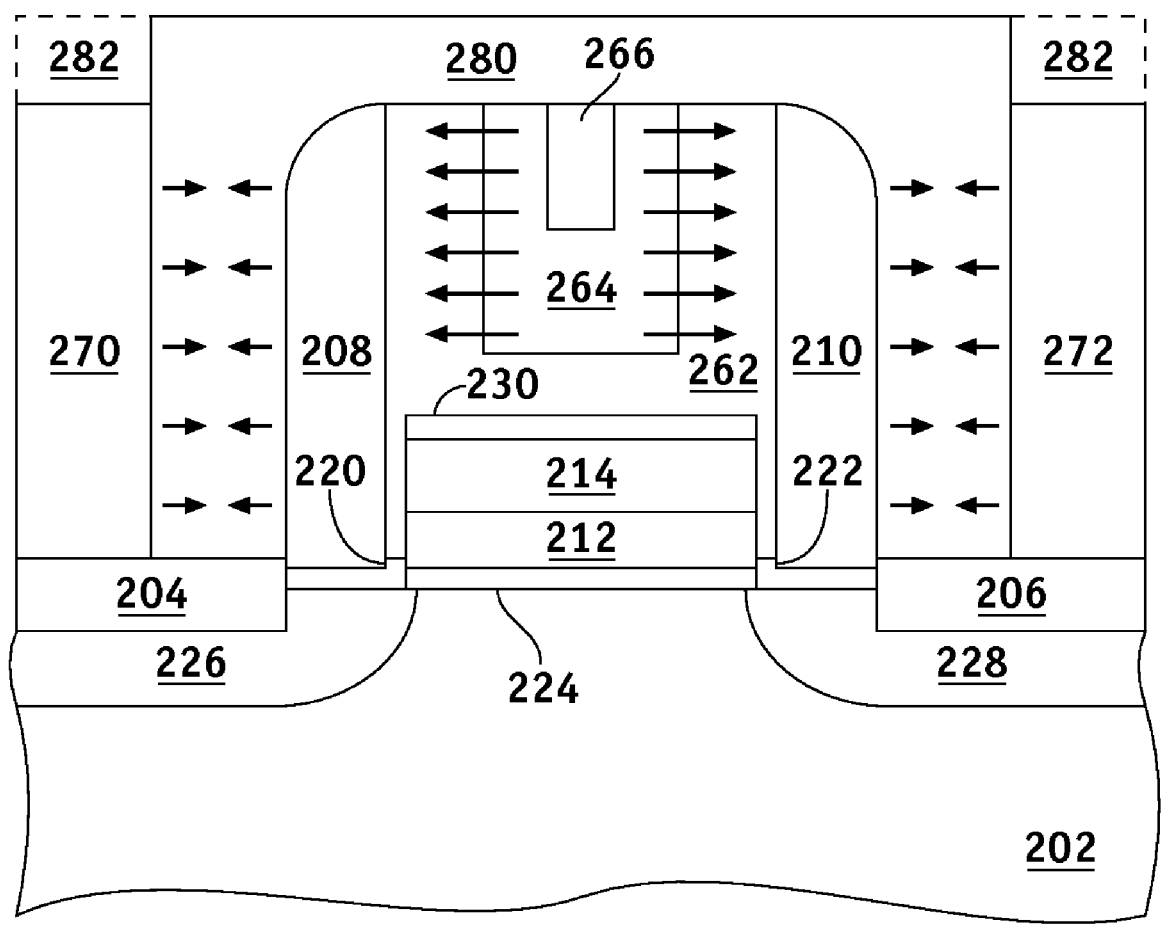

Thereafter, a compressive insulating material 280 is deposited in opening 274 and opening 276 (FIG. 13). As a result, compressive insulating material 280 fills the space between conductive via 270 and spacer 208, and the space between conductive via 272 and spacer 210. The inward facing arrows within openings 274/276 represent the compressive stress caused by compressive insulating material 280. The compressive insulating material tends to shrink after it is deposited within openings 274/276. This tendency towards shrinkage creates compressive stress within openings 274/276, which imparts inward forces on spacers 208/210 and conductive vias 270/272.

In addition, compressive insulating material 280 may be deposited over the tensile insulating material that resides in gate opening 252. This may occur concurrently with the deposition of compressive insulating material 280 in openings 274/276. Although FIG. 13 depicts an embodiment having a single layer of compressive insulating material, multiple layers of compressive insulating material may be deposited to fill openings 274/276.

In practice, the deposition of compressive insulating material on the wafer may result in the deposition of excess compressive insulating material 282 over conductive vias 270/272. The excess compressive insulating material 282 located over conductive vias 270/272 can be removed to expose the upper surfaces of conductive vias 270/272. To remove the compressive layer a contact mask is used. During the lithographic step, overexposure is used to make the opening wide enough to account for any possible misalignment with the first exposure of the contact (related to the formation of the via openings). This enables subsequent formation of conductive interconnects for conductive vias 270/272. FIG. 13 depicts excess compressive insulating material 282 in dashed lines to indicate that these areas will not appear in the resulting PMOS device. Notably, the section of compressive insulating material 280 over the gate structure remains intact.

Notably, spacer 208 serves as a retaining wall for the compressive insulating material 280 that fills opening 274. Likewise, spacer 210 serves as a retaining wall for the compressive insulating material that fills opening 276. These retaining walls prevent relaxation of the compressive insulating material, which is desirable to retain the compressive characteristics. This results in enhanced gate straining relative to conventional techniques that do not provide such retaining walls for the strain-inducing insulating material.

As depicted by the arrows in FIG. 13, the gate opening experiences tensile stress while spacers 208/210 are "pulled" by the compressive forces applied by compressive insulating material 280. In practice, this form of gate straining results in a significant mobility boost in the gate channel, while raising the valence band for the PMOS device. This effectively reduces the back scattering of carriers back into the source, which in turn increases drive current.

Thereafter, any number of known process steps can be performed to complete the fabrication of the PMOS device. It should be appreciated that a plurality of PMOS devices on a single wafer can be concurrently fabricated using the techniques and technologies described above. Furthermore, as mentioned above, a CMOS device implementation can be fabricated using the techniques and technologies described above. In a CMOS embodiment, the PMOS device areas can be protected using, for example, photoresist while the NMOS device areas are being fabricated. Conversely, the NMOS device areas can be protected while the PMOS device areas are being fabricated.

While at least one example embodiment has been presented in the foregoing detailed description, it should be appreciated that a vast number of variations exist. It should also be appreciated that the example embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising:
   providing a device structure on a semiconductor substrate, the device structure comprising a first spacer, a second spacer, a gate opening formed between the first spacer and the second spacer, a first oxide region adjacent to and outside the first spacer, and a second oxide region adjacent to and outside the second spacer;
   filling the gate opening with a compressive insulating material;
   forming a first conductive via in the first oxide region, and a second conductive via in the second oxide region;
   thereafter removing the first oxide region and the second oxide region; and
   depositing a tensile insulating material between the first conductive via and the first spacer, between the second conductive via and the second spacer, and over the compressive insulating material;
   wherein filling the gate opening with the compressive insulating material comprises:
   depositing a first layer of compressive insulating material in the gate opening; and
   depositing at least one additional layer of compressive insulating material on the first layer of compressive insulating material.

2. The method of claim 1, wherein providing the device structure comprises providing a metal gate layer between the first spacer and the second spacer, the gate opening terminating at the metal gate layer.

3. The method of claim 1, wherein providing the device structure comprises providing a metal gate layer between the first spacer and the second spacer, and providing a diffusion barrier layer above the metal gate layer, the gate opening terminating at the diffusion barrier layer.

4. The method of claim 1, wherein depositing the tensile insulating material comprises depositing the tensile insulating material between the first conductive via and the first spacer, between the second conductive via and the second spacer, over the compressive insulating material, over the first conductive via, and over the second conductive via.

5. The method of claim 4, further comprising removing the tensile insulating material located over the first conductive via and the second conductive via.

6. The method of claim 1, wherein filling the gate opening with the compressive insulating material comprises depositing at least one layer of compressive insulating material in the gate opening, over the first spacer, over the second spacer, over the first oxide region, and over the second oxide region.

7. The method of claim 6, further comprising removing excess compressive insulating material located over the first oxide region, over the second oxide region, and over the gate opening.

8. The method of claim 1, wherein forming the first conductive via and the second conductive via comprises:
   forming the first conductive via such that it reaches a first silicide contact of the semiconductor device; and
   forming the second conductive via such that it reaches a second silicide contact of the semiconductor device.

9. A method of fabricating a semiconductor device, the method comprising:
   providing a device structure on a semiconductor substrate, the device structure comprising a first spacer, a second spacer, a gate opening formed between the first spacer and the second spacer, a first oxide region adjacent to and outside the first spacer, and a second oxide region adjacent to and outside the second spacer;
   filling the gate opening with a tensile insulating material;
   forming a first conductive via in the first oxide region, and a second conductive via in the second oxide region;
   thereafter removing the first oxide region and the second oxide region; and depositing a compressive insulating material between the first conductive via and the first spacer, between the second conductive via and the second spacer, and over the tensile insulating material;

wherein filling the gate opening with the tensile insulating material comprises:

depositing a first layer of tensile insulating material in the gate opening: and depositing at least one additional layer of tensile insulating material on the first layer of tensile insulating material.

10. The method of claim 9, wherein providing the device structure comprises providing a metal gate layer between the first spacer and the second spacer, the gate opening terminating at the metal gate layer.

11. The method of claim 9, wherein providing the device structure comprises providing a metal gate layer between the first spacer and the second spacer, and providing a diffusion barrier layer above the metal gate layer, the gate opening terminating at the diffusion barrier layer.

12. The method of claim 9, wherein depositing the compressive insulating material comprises depositing the compressive insulating material between the first conductive via and the first spacer, between the second conductive via and the second spacer, over the tensile insulating material, over the first conductive via, and over the second conductive via.

13. The method of claim 12, further comprising removing the compressive insulating material located over the first conductive via and the second conductive via.

14. The method of claim 9, wherein filling the gate opening with the tensile insulating material comprises depositing at least one layer of tensile insulating material in the gate opening, over the first spacer, over the second spacer, over the first oxide region, and over the second oxide region.

15. The method of claim 14, further comprising removing excess tensile insulating material located over the first oxide region, over the second oxide region, and over the gate opening.

16. The method of claim 9, wherein forming the first conductive via and the second conductive via comprises:

forming the first conductive via such that it reaches a first silicide contact of the semiconductor device; and forming the second conductive via such that it reaches a second silicide contact of the semiconductor device.

17. A method of fabricating a semiconductor device, the method comprising:

providing a gate structure on a semiconductor substrate, the gate structure comprising a gate insulator overlying the semiconductor substrate, a gate metal layer overlying the gate insulator, polysilicon overlying the gate metal layer, a first sidewall spacer, and a second sidewall spacer, wherein the gate insulator, the gate metal layer, and the polysilicon are all located between the first sidewall spacer and the second sidewall spacer;

thereafter, forming a first oxide region adjacent to and outside the first spacer, and a second oxide region adjacent to and outside the second spacer;

thereafter, etching away the polysilicon to form a gate opening between the first sidewall spacer and the second sidewall spacer;

thereafter, filling the gate opening with a compressive insulating material;

thereafter, forming a first conductive via in the first oxide region, and a second conductive via in the second oxide region;

thereafter, removing the first oxide region and the second oxide region; and thereafter, depositing a tensile insulating material between the first conductive via and the first spacer, between the second conductive via and the second spacer, and over the compressive insulating material.

18. A method of fabricating a semiconductor device, the method comprising:

providing a gate structure on a semiconductor substrate, the gate structure comprising a gate insulator overlying the semiconductor substrate, a gate metal layer overlying the gate insulator, polysilicon overlying the gate metal layer, a first sidewall spacer, and a second sidewall spacer, wherein the gate insulator, the gate metal layer, and the polysilicon are all located between the first sidewall spacer and the second sidewall spacer;

thereafter, forming a first oxide region adjacent to and outside the first spacer, and a second oxide region adjacent to and outside the second spacer;

thereafter, etching away the polysilicon to form a gate opening between the first sidewall spacer and the second sidewall spacer;

thereafter, filling the gate opening with a tensile insulating material;

thereafter, forming a first conductive via in the first oxide region, and a second conductive via in the second oxide region;

thereafter, removing the first oxide region and the second oxide region; and thereafter, depositing a compressive insulating material between the first conductive via and the first spacer, between the second conductive via and the second spacer, and over the tensile insulating material.

* * * * *